(12) United States Patent
Looney et al.

(10) Patent No.: US 10,775,609 B2
(45) Date of Patent: Sep. 15, 2020

(54) MICROMECHANICAL DEVICE WITH VIA STRUT

(71) Applicant: Texas Instruments Incorporated, Dallas, TX (US)

(72) Inventors: Stephen Howard Looney, Austin, TX (US); Jose Antonio Martinez, Murphy, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 193 days.

(21) Appl. No.: 16/125,237

(22) Filed: Sep. 7, 2018

(65) Prior Publication Data

US 2020/0081244 A1    Mar. 12, 2020

(51) Int. Cl.
| | | |
|---|---|---|
| *G02B 26/00* | (2006.01) | |
| *G02B 26/08* | (2006.01) | |
| *G02F 1/167* | (2019.01) | |
| *B81C 1/00* | (2006.01) | |
| *B81B 7/02* | (2006.01) | |
| *G02F 1/1675* | (2019.01) | |
| *G02F 1/1676* | (2019.01) | |

(52) U.S. Cl.
CPC .......... *G02B 26/0841* (2013.01); *B81B 7/02* (2013.01); *B81C 1/00341* (2013.01); *G02B 26/005* (2013.01); *G02F 1/167* (2013.01); *G02F 1/1676* (2019.01); *G02F 2001/1678* (2013.01)

(58) Field of Classification Search
CPC .... G02B 26/0841; G02B 26/005; B81B 7/02; B81C 1/00341; G02F 1/167; G02F 1/1676; G02F 2001/1678
USPC ......... 359/196.1, 197.1, 198.1, 199.2, 212.1, 359/213.1, 214.1, 221.2, 223.1, 224.1, 359/224.2, 225.1, 226.2, 291, 298
See application file for complete search history.

(56) References Cited

U.S. PATENT DOCUMENTS

| | | | |
|---|---|---|---|
| 9,335,540 B2 | 5/2016 | Sherwin et al. | |
| 2007/0007122 A1* | 1/2007 | Rothenbury | ........ H01L 21/2855 204/192.1 |

* cited by examiner

*Primary Examiner* — William Choi
(74) *Attorney, Agent, or Firm* — Michelle F. Murray; Charles A. Brill; Frank D. Cimino

(57) ABSTRACT

Described examples include a micromechanical device including a substrate and a base formed on a surface of the substrate; and a first layer extending from the base to a plane separated from the base by a via. The first layer forms an outer layer of the via and has a portion lying in the plane and surrounding the via. A first fill is formed in a first portion of the via. A strut is in the via and on the first fill. A second fill is in a second portion of the via on the strut and extends from the strut to the plane. A second layer is over the second fill and at least a portion of the second layer is over the portion of the first layer lying in the plane.

29 Claims, 10 Drawing Sheets

MICROMECHANICAL DEVICE WITH VIA STRUT

TECHNICAL FIELD

This relates generally to microelectromechanical systems (MEMS), and more particularly to digital micromirror devices (DMD).

BACKGROUND

Micromirror-based systems display images by projecting the images onto a display plane. A digital micromirror device (DMD), such as a Texas Instruments DLP® micromirror device, has an array of micromirror light modulators. Those micromirrors are individually actuatable in respective "ON" or "OFF" positions to collectively form an image. Using a pulse-width modulation technique, the image is controlled by bit planes (generated per image frame), based on imaging data that the DMD receives per pixel position (such as 8-bit red-green blue (RGB) data per pixel per frame). In the "ON" position, the micromirror reflects incident light onto the display plane (or other display target). In the "OFF" position, the micromirror reflects incident light away from the display plane. During the image frame display period (eye integration time): (a) the color (chroma) of each displayed pixel is controlled by relative proportions of different primary and/or secondary colors of incident light directed onto the display plane; and (b) the intensity (lumina) of each displayed pixel is controlled by a relative proportion of "ON" time vs. "OFF" time for the pixel's respective micromirror (i.e., total of the weighted bit-position subinterval display times in which a "1" appears for the corresponding pixel in the series of bit planes for that frame).

In a DMD's MEMS structure, the pixel's respective micromirror is supported on a via support or other underlying support structure above a substrate. The micromirror structure allows for micromirror movement between the "ON" and "OFF" positions in response to electrostatic forces, which are applied by associated complementary metal-oxide semiconductor (CMOS) integrated circuitry.

SUMMARY

In an example, a micromechanical device includes: a substrate and a base formed on a surface of the substrate; and a first layer extending from the base to a plane separated from the base by a via. The first layer forms an outer layer of the via and has a portion lying in the plane and surrounding the via. A first fill is formed in a first portion of the via. A strut is in the via on the first fill. A second fill is in a second portion of the via and extends from the strut to the plane. A second layer is over the second fill, and at least a portion of the second layer is over the portion of the first layer lying in the plane.

DETAILED DESCRIPTION

Figure 1A:
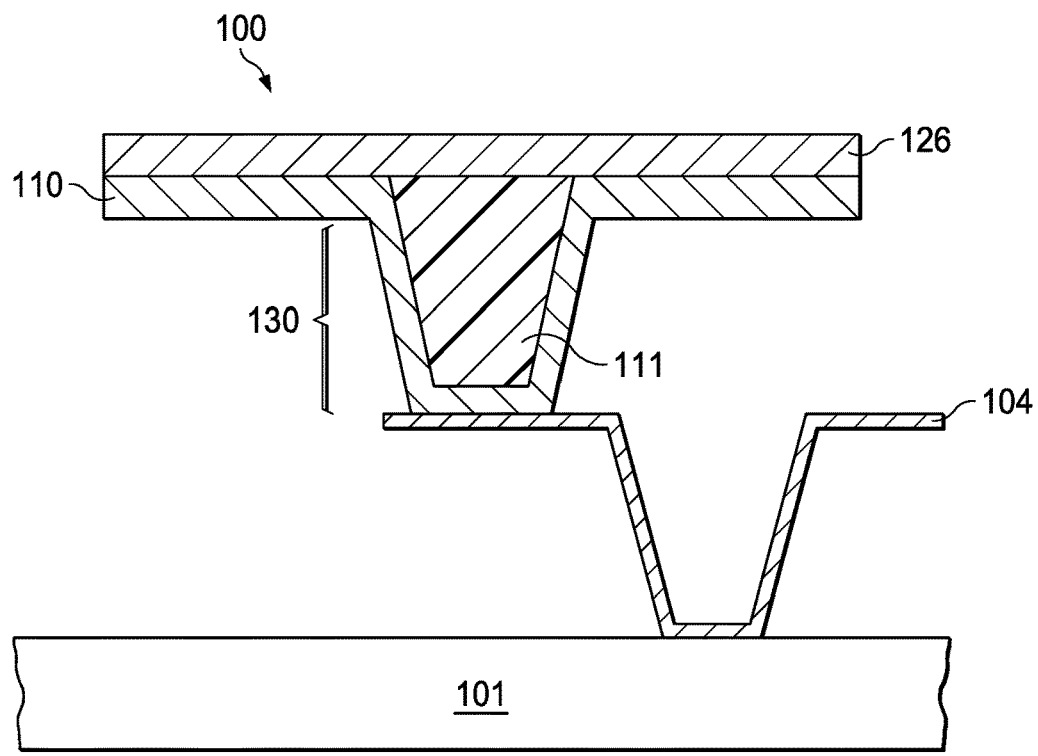
FIGS. 1A and 1B (collectively "FIG. 1") are cross sectional views of a micromirror device.

In the drawings, corresponding numerals and symbols generally refer to corresponding parts unless otherwise indicated. The drawings are not necessarily drawn to scale.

In this description, the term "coupled" may include connections made with intervening elements, and additional elements and various connections may exist between any elements that are "coupled." Also, in this description, the term "on" may include intervening elements between an element that is "on" another element.

Figure 1B:
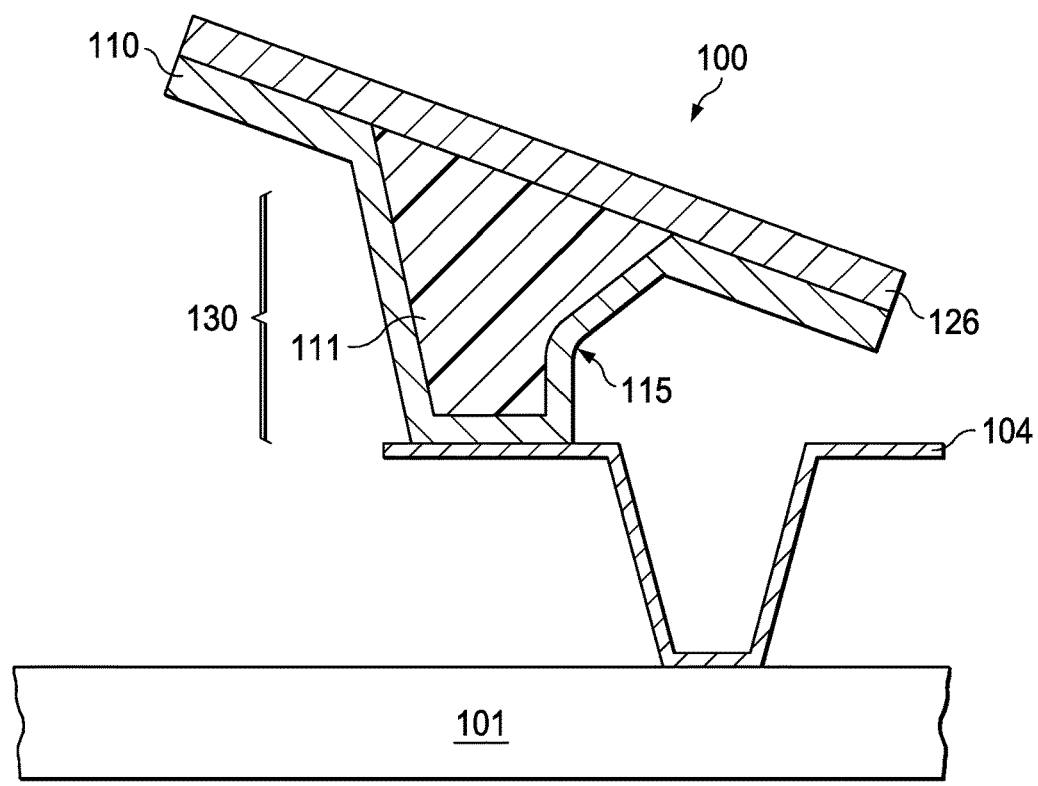

FIGS. 1A and 1B (collectively "FIG. 1") are cross sectional views of a micromirror device 100 ("mirror"). In FIG. 1A, torsional hinge 104 is on substrate 101. As oriented in FIGS. 1A and 1B, a substrate 101 is at the bottom of the drawing and arranged to be lying in a horizontal plane. Torsional hinge 104 is placed on an upper surface of substrate 101 as oriented in FIGS. 1A-1B. Substrate 101 can be a semiconductor material, such as a silicon wafer, or an epitaxial layer on a wafer. Substrate 101 can also be formed of other materials. Torsional hinge 104 may serve as an electrical contact or a base, or as a torsion bar for the movement of micromirror device 100. Micromirror device 100 includes layer 110, which is a metal layer in this example. Layer 110 may include aluminum alloys, for example. Layer 110 extends vertically from torsional hinge 104 upwards as oriented in FIGS. 1A-1B to the horizontal portion of micromirror device 100 where layer 110 contacts layer 126. In this example, layer 126 includes an aluminum alloy. The portion of micromirror device 100 extending upwards in FIGS. 1A-1B from torsional hinge 104 to the horizontal portion of micromirror device 100 also includes filler 111. In this example, filler 111 is a polymer, such as a bottom anti-reflective coating (BARC), or gap fill material GF26. As shown in FIG. 1, via 130 is the portion of micromirror device 100 that extends upwards from torsional hinge 104 to the horizontal portion of micromirror device 100.

FIG. 1B shows a cross section of a failure mode of micromirror device 100. In operation, micromirror device 100 operates by tilting from side to side (the tilt is not shown for simplicity of description). In most configurations, the micromirror tilts on an axis perpendicular to the length of torsional hinge 104. In that configuration, torsional hinge 104 twists along an axis running parallel to the page as oriented in FIGS. 1A-1B.

FIG. 1B shows a crimp 115 in via 130. Crimp 115 can occur when addressing circuitry (not shown) applies electrostatic force between micromirror device 100 and substrate 101 to actuate micromirror device 100 to tilt to one side. As described hereinabove, filler 111 is a polymer, which (even though it is cured during fabrication) is still relatively soft, limiting its contribution to mechanical integrity of via 130. During mechanical failure of via 130, crimp 115 forms, and permanently tilts micromirror device 100, thereby rendering it inoperable for light modulation. In another failure mode, fractures (not shown) can form on the sidewall of via 130.

Figure 2A:
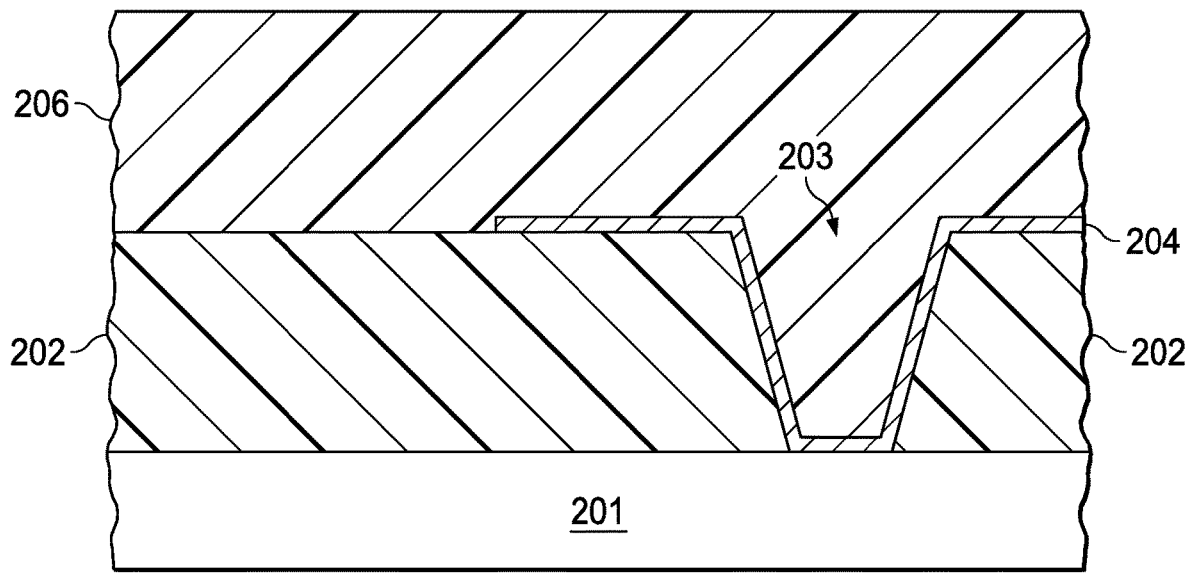
FIGS. 2A-2O (collectively "FIG. 2") are a series of cross sectional views of results of an example method and the structure of a micromechanical device.
Figure 2B:
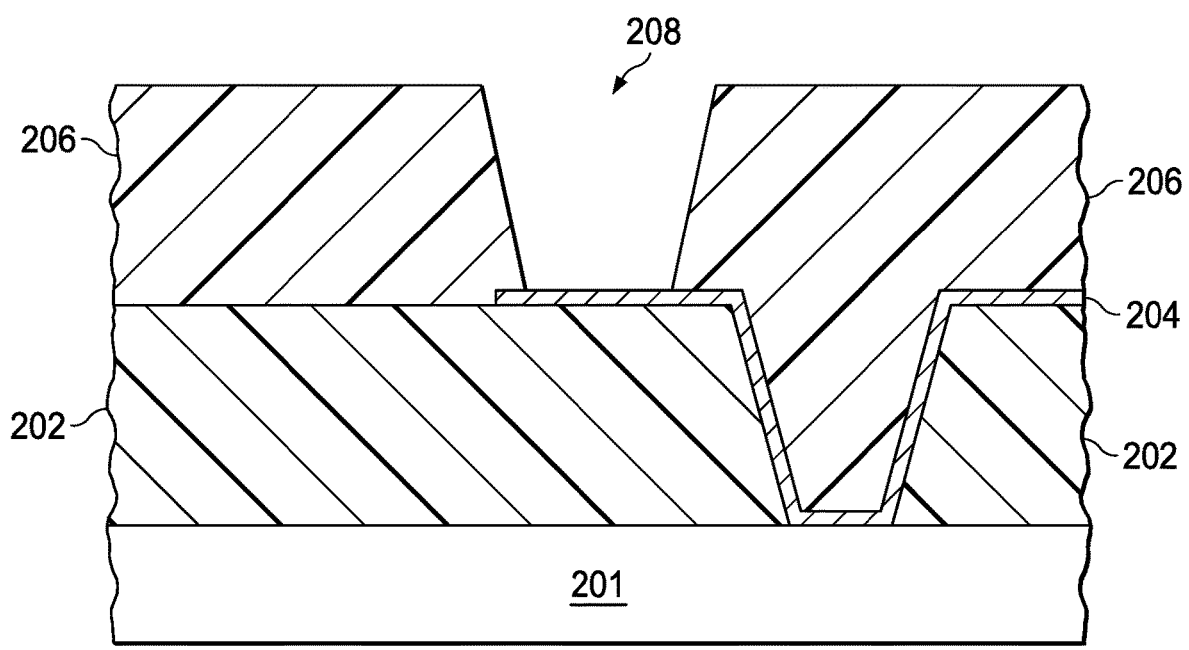
Figure 2C:
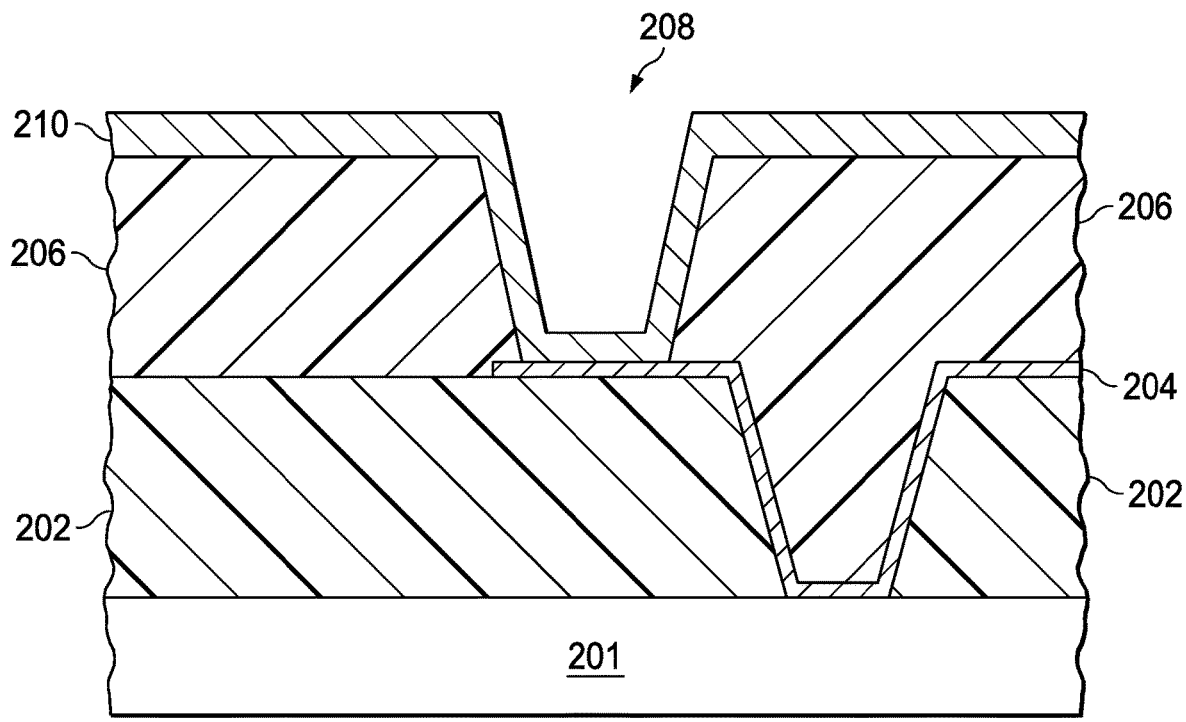
Figure 2D:
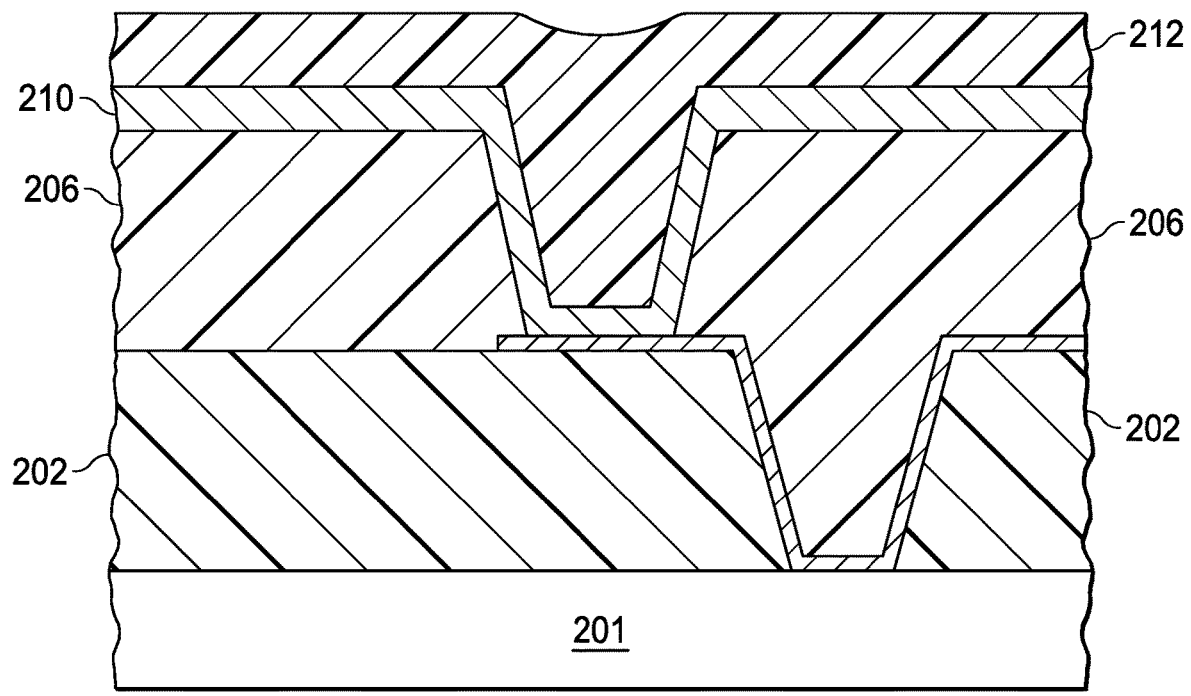
Figure 2E:
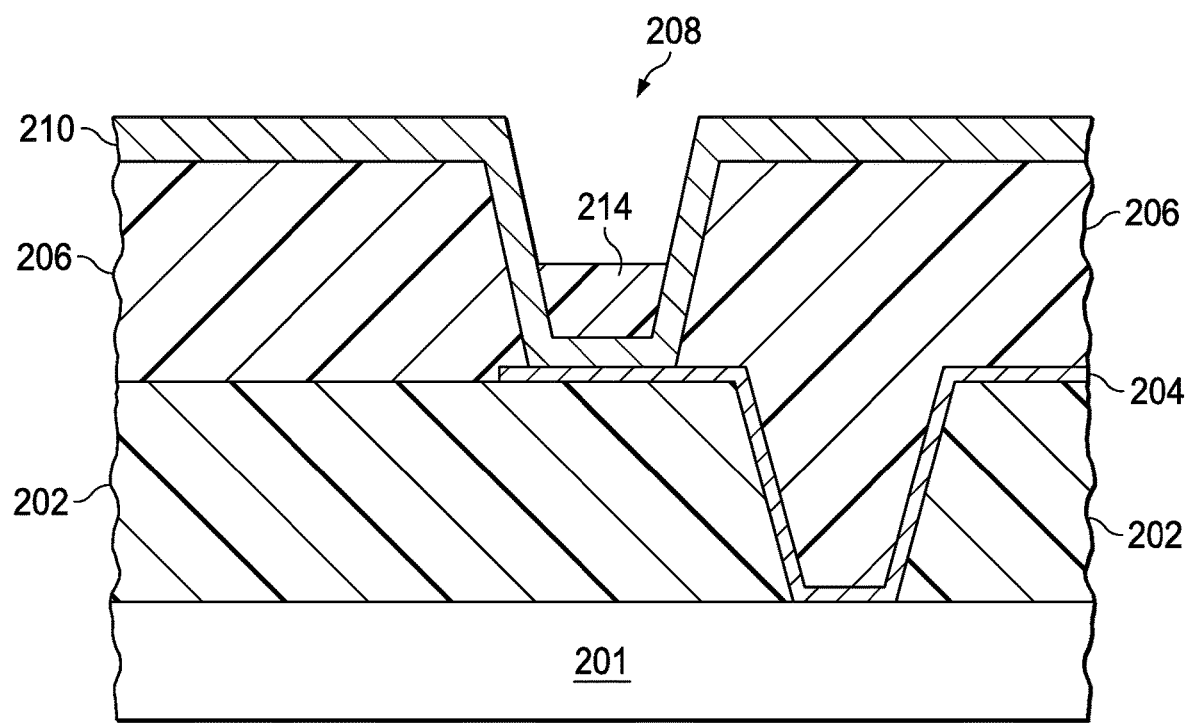
Figure 2F:
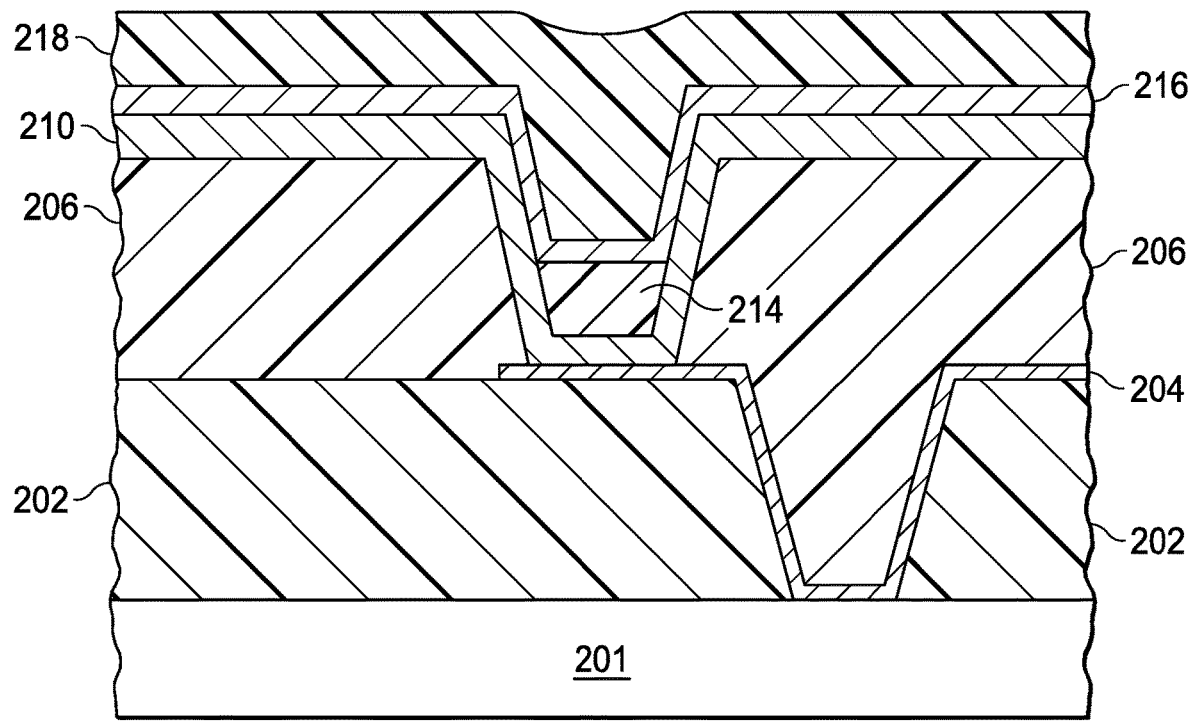
Figure 2G:
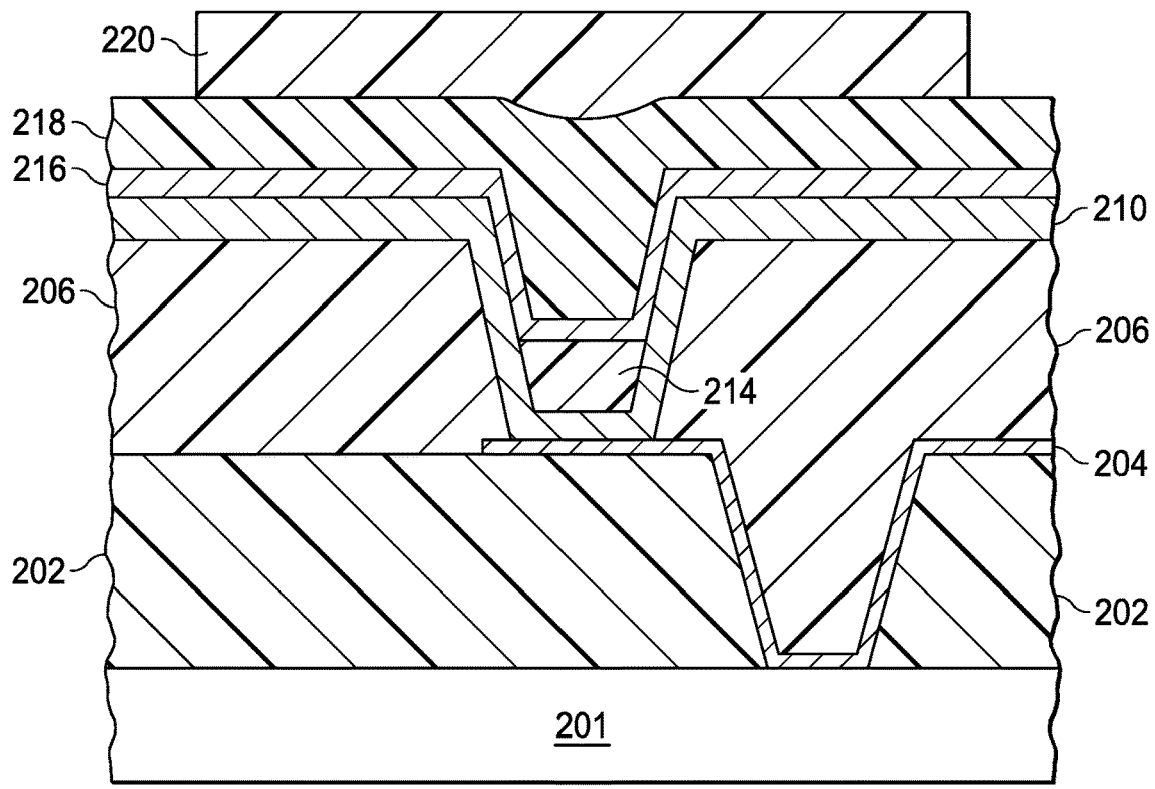
Figure 2H:
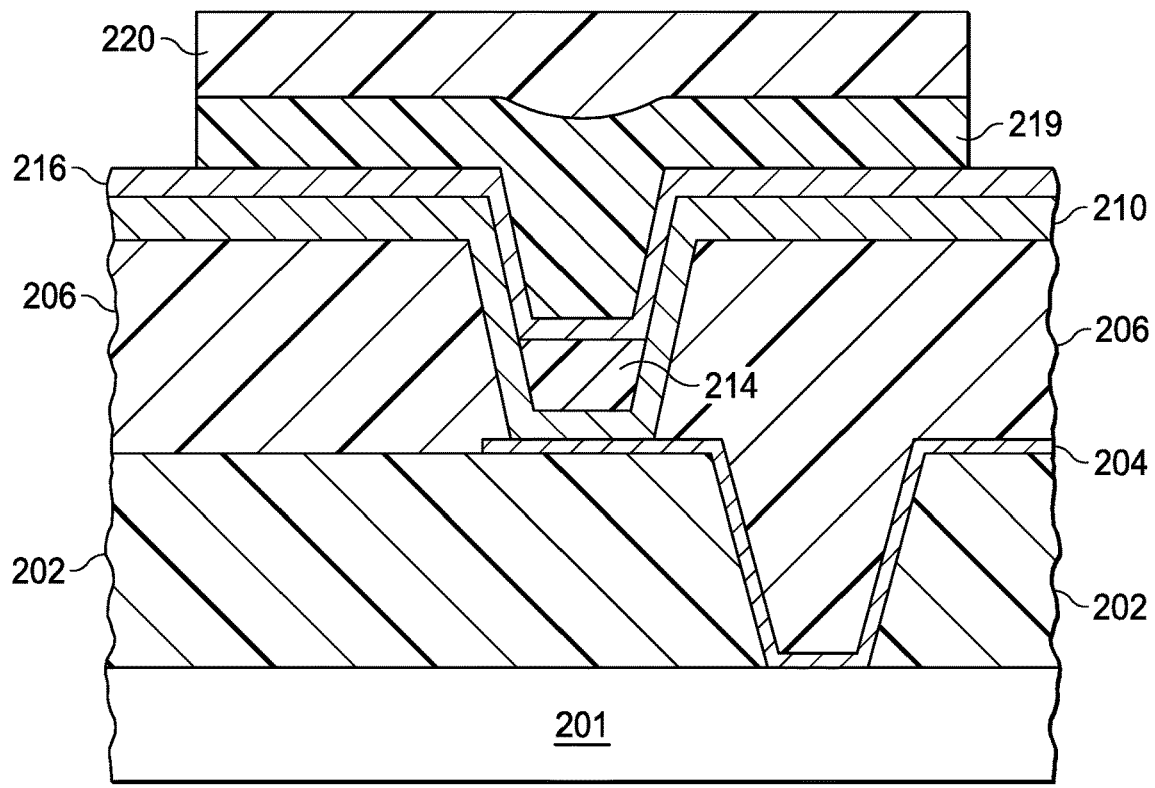
Figure 2I:
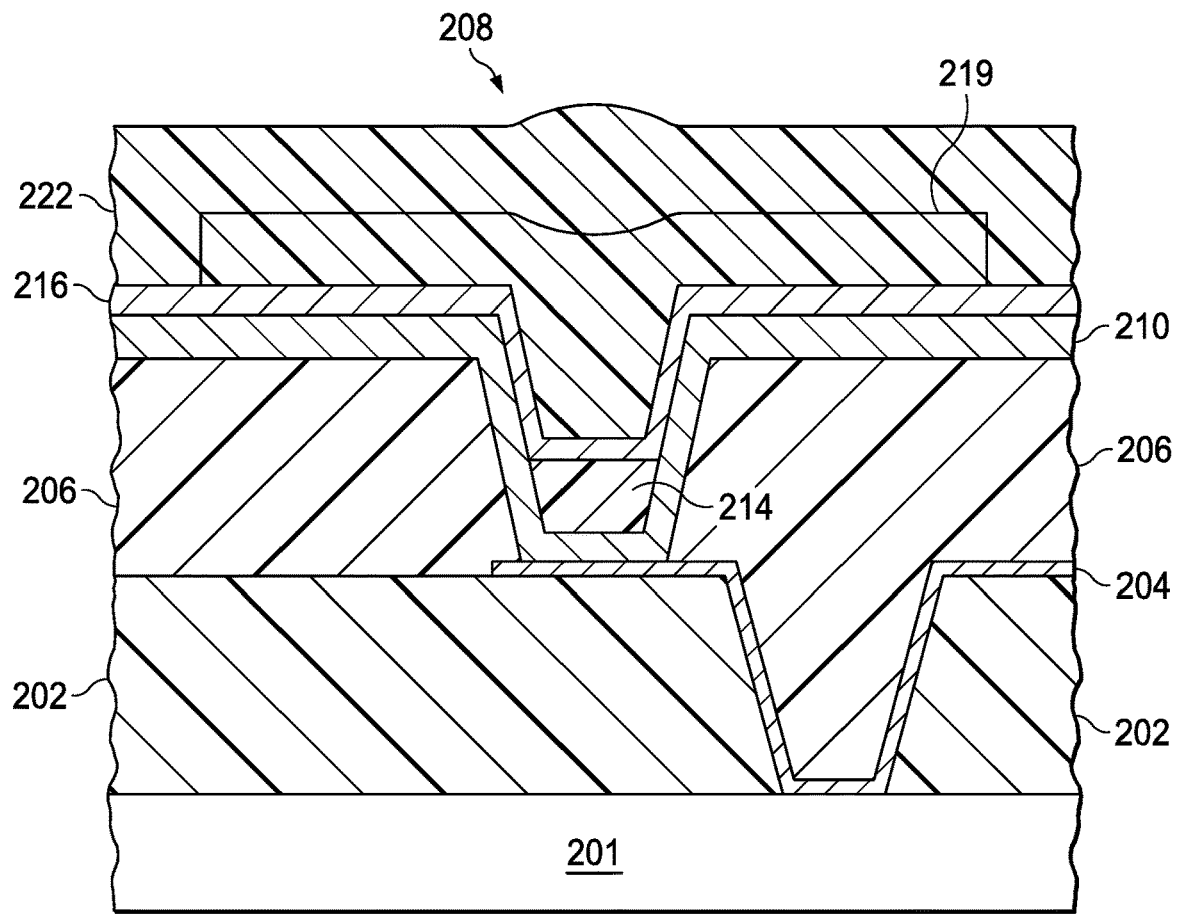
Figure 2J:
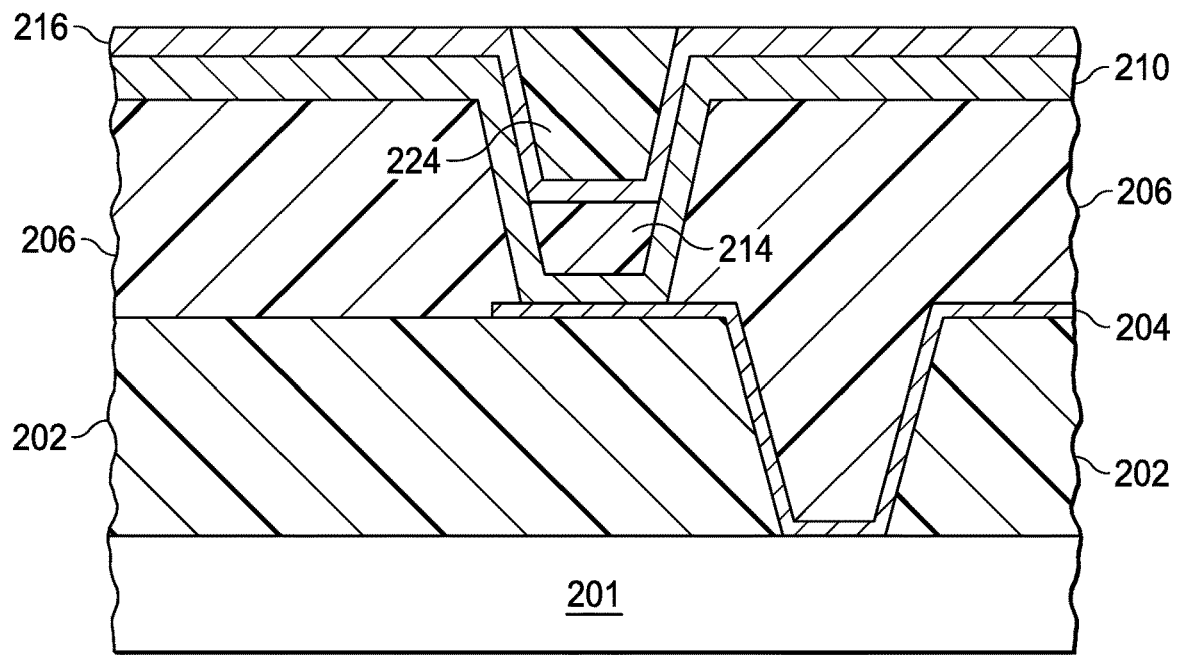
Figure 2K:
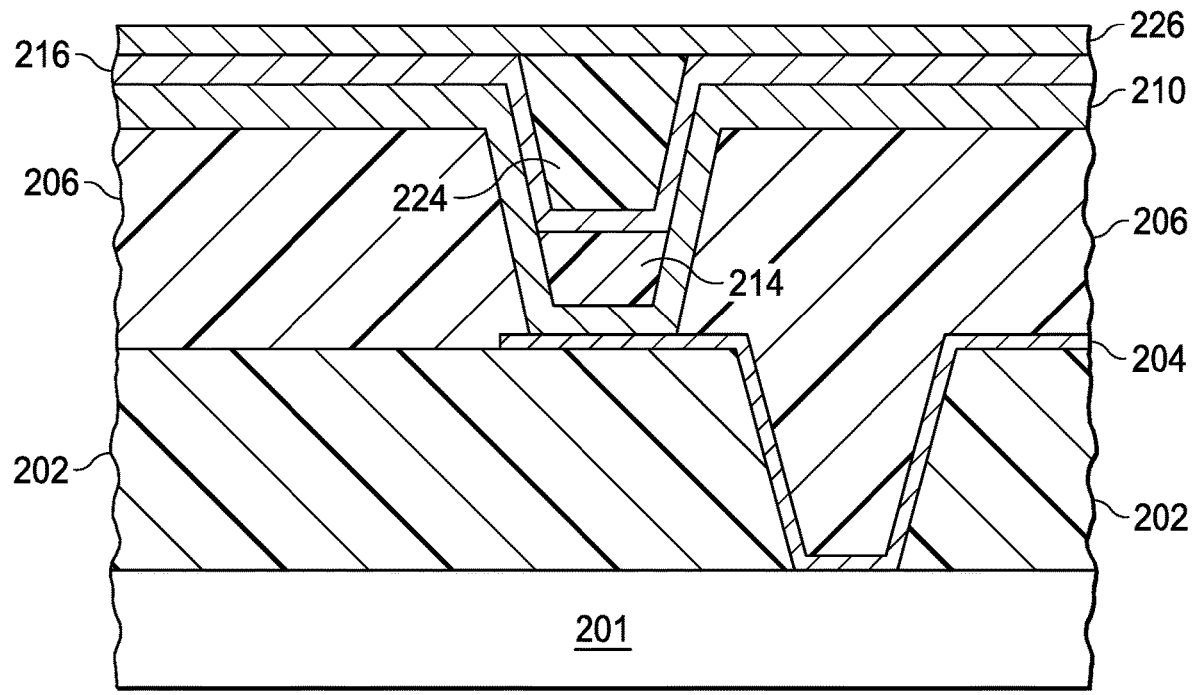
Figure 2L:
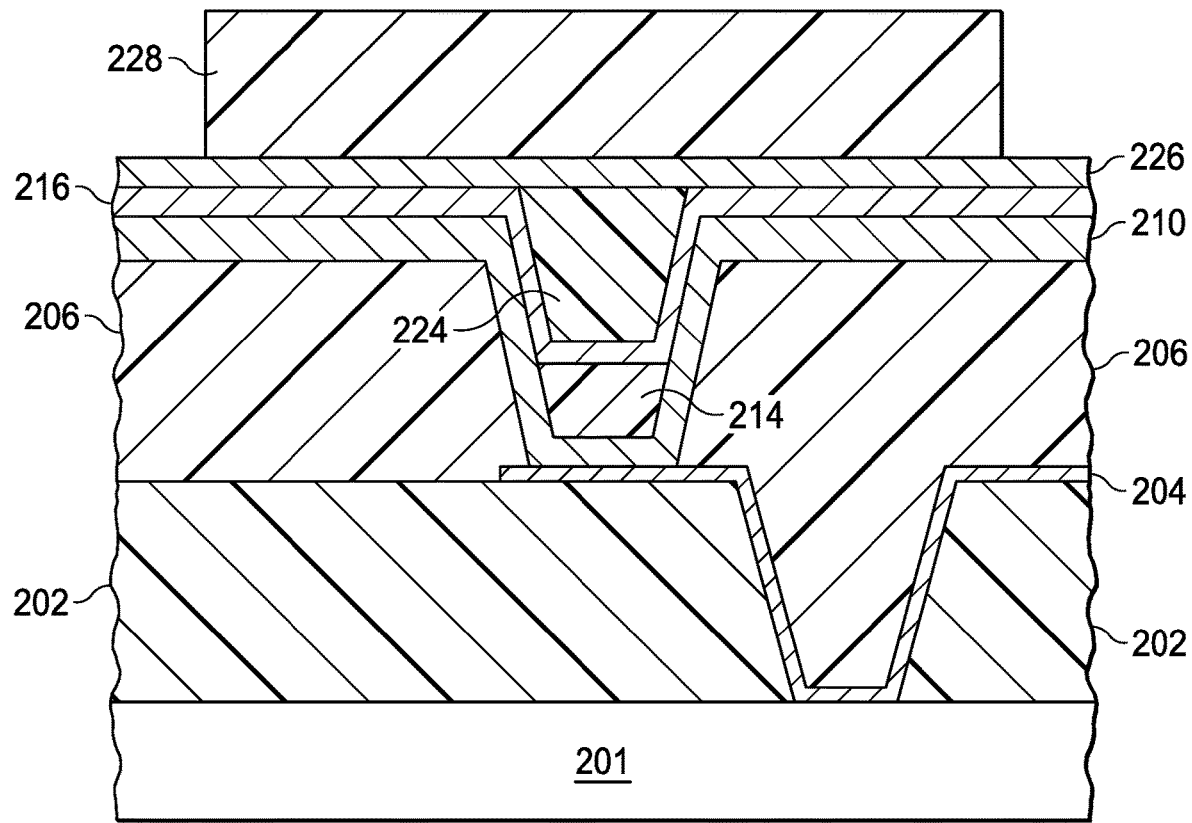
Figure 2M:
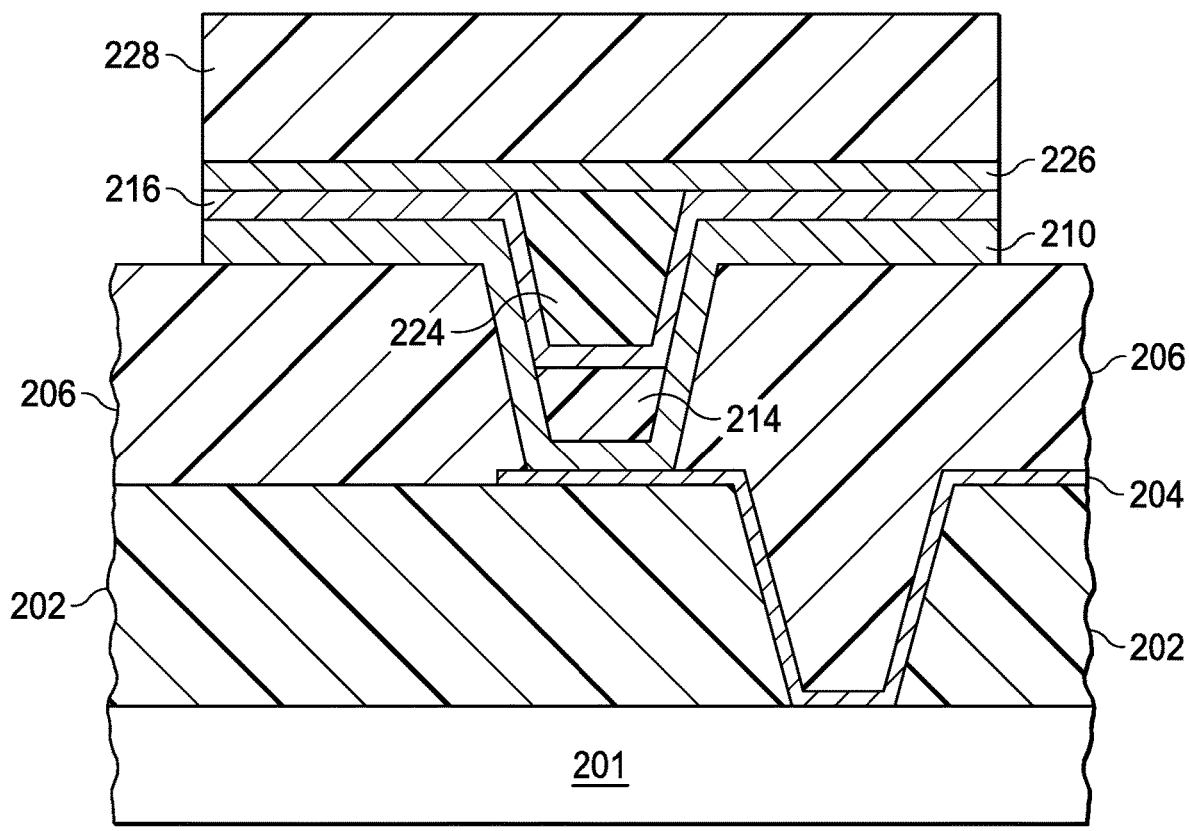
Figure 2N:
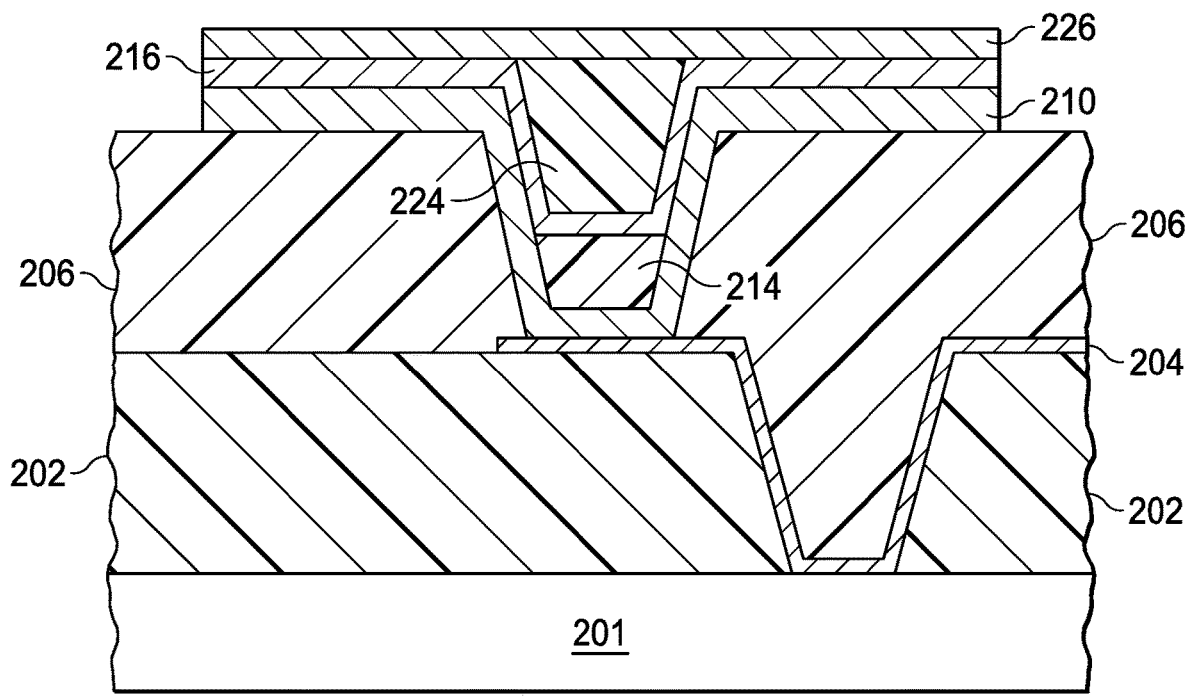
Figure 2O:
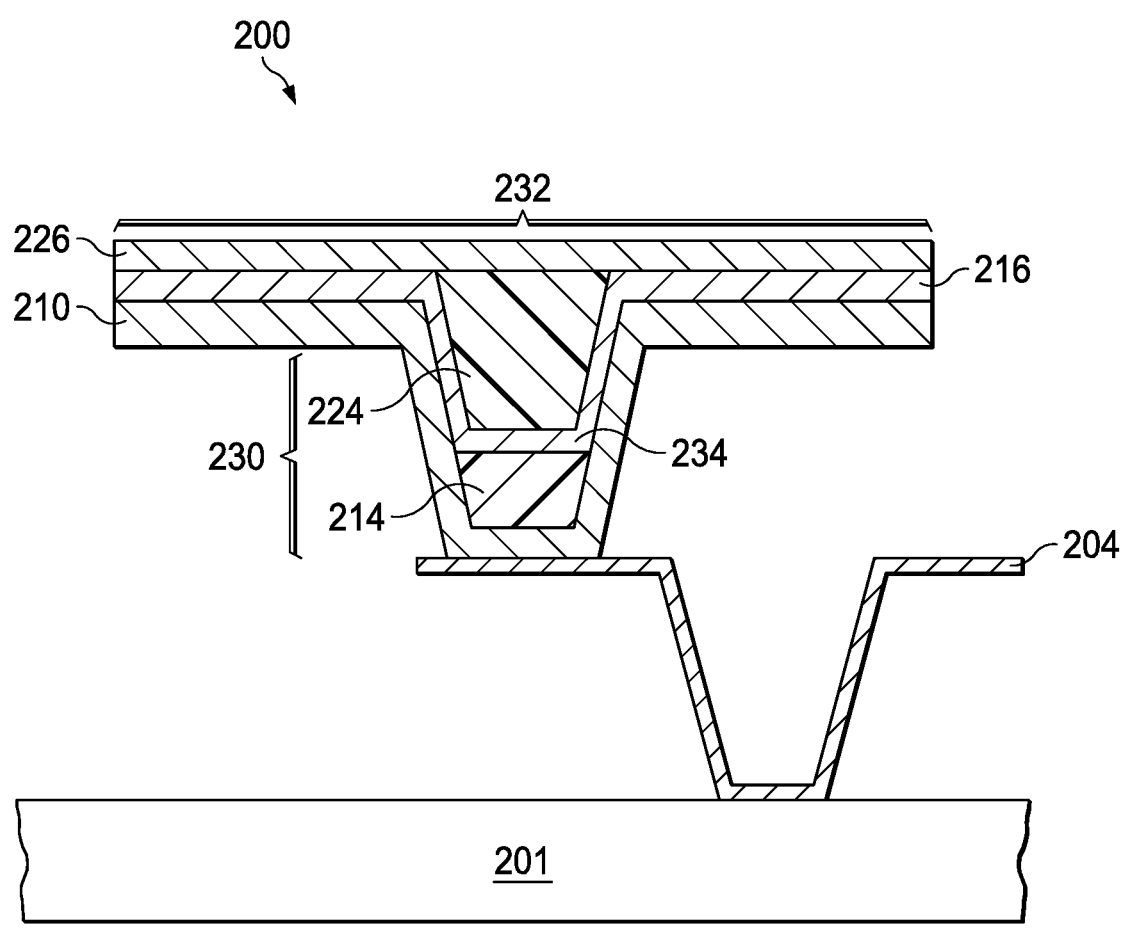

FIGS. 2A-2O (collectively "FIG. 2") are a series of cross sectional views of the results of steps of an example method and the resulting structure of a micromechanical device. In this example, the micromechanical device is a micromirror device. In FIGS. 2A-2O, similar reference labels are used for elements similar to those in FIGS. 1A-1B, for clarity. For example, substrate 201 corresponds to substrate 101 in FIG. 1A. Also, as in FIGS. 1A-1B, the substrate 201 is lying in a horizontal plane with the micromirror device formed on an upper surface of substrate 201. In an alternative arrangement, the torsional hinge 204 is not used, and the via 230 will contact a portion of substrate 201 that forms a base. In FIG. 2A, a sacrificial layer 202 is formed on substrate 201. In this example, sacrificial layer 202 is photoresist. An opening 203 is then formed in sacrificial layer 202. The opening is formed by exposing sacrificial layer 202 to a pattern of light and developing the layer 202 to remove the material in opening 203. A metal layer is then deposited and patterned over sacrificial layer 202 and opening 203 to form torsional hinge 204. In this example, torsional hinge 204 serves as a base for via 230 (see FIG. 2O), as described further hereinbelow. Another sacrificial layer 206 is then formed on sacrificial layer 202 and torsional hinge 204. In this example, sacrificial layer 206 is photoresist.

In the step of FIG. 2B, an opening 208 in sacrificial layer 206 is formed by exposing sacrificial layer 206 to a pattern of light and removing (developing away) the material in opening 208. In this example, opening 208 has a circular profile from the viewpoint looking into the opening at the surface of sacrificial layer 206. Therefore, opening 208 has the form of an inverted conical frustum.

In the step shown in FIG. 2C, a layer 210 forms on the surface of sacrificial layer 206 and extends into opening 208, so that layer 210 contacts torsional hinge 204 in the bottom of opening 208. In this example, layer 210 is an aluminum alloy layer deposited by physical vapor deposition (PVD). In at least one example, the layer 210 has a thickness from 20 to 100 nm.

In the step shown in FIG. 2D, layer 212 is deposited on the surface of layer 210. In an example, layer 212 is a polymer layer, such as BARC or GF26. A suitable material for layer 212 is an organic polymer BARC material formulation, which is sufficiently flowable to be applied as a spin-on coating and is subsequently readily removable using an oxygen plasma ash as shown in FIG. 2E described hereinbelow. An example suitable choice for the material of layer 212 is a KrF-series BARC product from AZ Electronic Materials, such as AZ KrF17B, designed for thin layer application below a photoresist for deep ultra-violet (DUV) wavelength lithography. Other example suitable choices include Shipley AR-3 (available from Shipley Company, LLC), Brewer 42P and Brewer GF26 (available from Brewer Science, Inc.) coating materials. Using a BARC material offers advantages over using a photoresist. For example, the BARC may have a thickness between 20 and 200 nm.

In the step shown in FIG. 2E, layer 212 is etched using an anisotropic etch (such as oxygen reactive ion etching (RIE)) to form a lower fill 214 that fills half of opening 208 and will fill the lower portion of via 230 (see FIG. 2O) as described further hereinbelow. In other examples, lower fill 214 fills less or more than half of opening 208.

In the step shown in FIG. 2F a layer 216 is deposited followed by layer 218. In this example, layer 216 is an aluminum alloy layer deposited by physical vapor deposition (PVD) to a thickness of between 1 and 50 nm. Layer 218 is a BARC layer deposited by spin-on deposition. Like layer 212, layer 218 may be formed using the other materials described hereinabove.

In the step shown in FIG. 2G, a patterned layer of photoresist 220 is formed using photolithography.

In the step of FIG. 2H, portions of layer 218 not covered by photoresist 220 are removed using a plasma etch technique, such as oxygen plasma etch, to form pillar 219. In an alternative example, the portions of layer 218 not covered by photoresist 220 are thinned, but not removed completely.

In the steps shown in FIG. 2I, photoresist 220 is removed (FIG. 2H), and a layer of material is deposited that is the same or similar material as layer 218 (see FIG. 2G, described hereinabove). Pillar 219 and the layer deposited merge to form layer 222. Layer 222 includes a hump over opening 208 where layer 222 is over pillar 219.

In the steps shown in FIG. 2J, layer 222 is etched back, such as using an oxygen RIE process to form upper fill 224. Upper fill 224 fills the remainder or upper portion of opening 208 and will fill the upper portion of via 230 (FIG. 2O), as described further hereinbelow. The additional material over opening 208 enables the etch of FIG. 2J to provide an upper fill 224 with a nearly flat upper surface that is flush with the top surface of layer 216 but may extend above the top surface of layer 216 by less than 5% of the total height of via 230. Also, the steps of FIGS. 2G-2J are described in co-owned U.S. Pat. No. 9,335,540, which is hereby fully incorporated herein by reference. The flat top surface of upper fill 224 helps reduce any dimpling on the upper surface of the micromirror device that might otherwise occur, as described further hereinbelow.

The step of FIG. 2K illustrates the deposition of layer 226. In this example, layer 226 is an aluminum alloy layer deposited by physical vapor deposition (PVD) to a thickness of between 20 and 60 nm. The flat top surface of upper fill 224 helps avoid dimpling of layer 226 above upper fill 224. The combined thickness of layers 210, 216 and 226 is 150 to 200 nm. This thickness is the final thickness of the mirror in the completed micromirror device and the finished size of the mirror. The mirror's thickness is selected according to speed of operation desired, the mirror size and other factors. The step shown in FIG. 2L forms a patterned photoresist layer 228 using photolithography. The step shown in FIG. 2M uses photoresist layer 228 to pattern layers 210, 216 and 226 in the form of the desired mirror. The step shown in FIG. 2N removes photoresist layer 228 (see FIG. 2M). The step shown in FIG. 2O removes sacrificial layer 202 and sacrificial layer 206 using an isotropic plasma etching technique, such as with oxygen.

Accordingly, FIGS. 2A-2O show steps performed to form micromirror device 200. Micromirror device 200 includes strut 234 extending horizontally across via 230. Mirror 232 is in a plane separated from and parallel to an upper surface of a base, which is torsional hinge 204, in this example. Layer 210 serves as the lower portion of mirror 232 and the outer layer of via 230. In this example, via 230 has a height between 100 and 2,000 nm between: the upper surface of the base (torsional hinge 204); and the lower surface of mirror 232. Via 230 has a diameter between 10 and 10,000 nm. In this example, strut 234 has a thickness between 1 nm and 50 nm, abuts layer 210 at the entire circumference of strut 234, and provides additional strength to via 230 to lower a possible risk of crimping, as shown in FIG. 1B. Thus the strut 234 (a "via strut") provides mechanical support and increased strength to reinforce via 230.

In the example described hereinabove, the strut is formed from a metal layer. In the particular example of FIGS. 2A-2O, the metal layer is an aluminum alloy. However, the strut can be formed of other materials that provide increased mechanical strength to the via 230. In an alternative example, strut 234 can be formed of non-metal layers. In additional examples, the non-metal layer can include layers of material used in semiconductor processes, such as: silicon dioxide ($SiO_2$, or "oxide"); titanium nitride (TiN, which can be formed as a ceramic or as a metallic layer); silicon oxynitride ($SiO_xN_y$, where x and y can vary, such as $SiO_3N_4$); silicon nitride ($Si_3N_4$); and aluminum oxide (Al$_2$O$_3$). Other materials that form a layer compatible with the methods described herein, and that provide mechanical strength, can also be used to form the strut.

Figure 3:
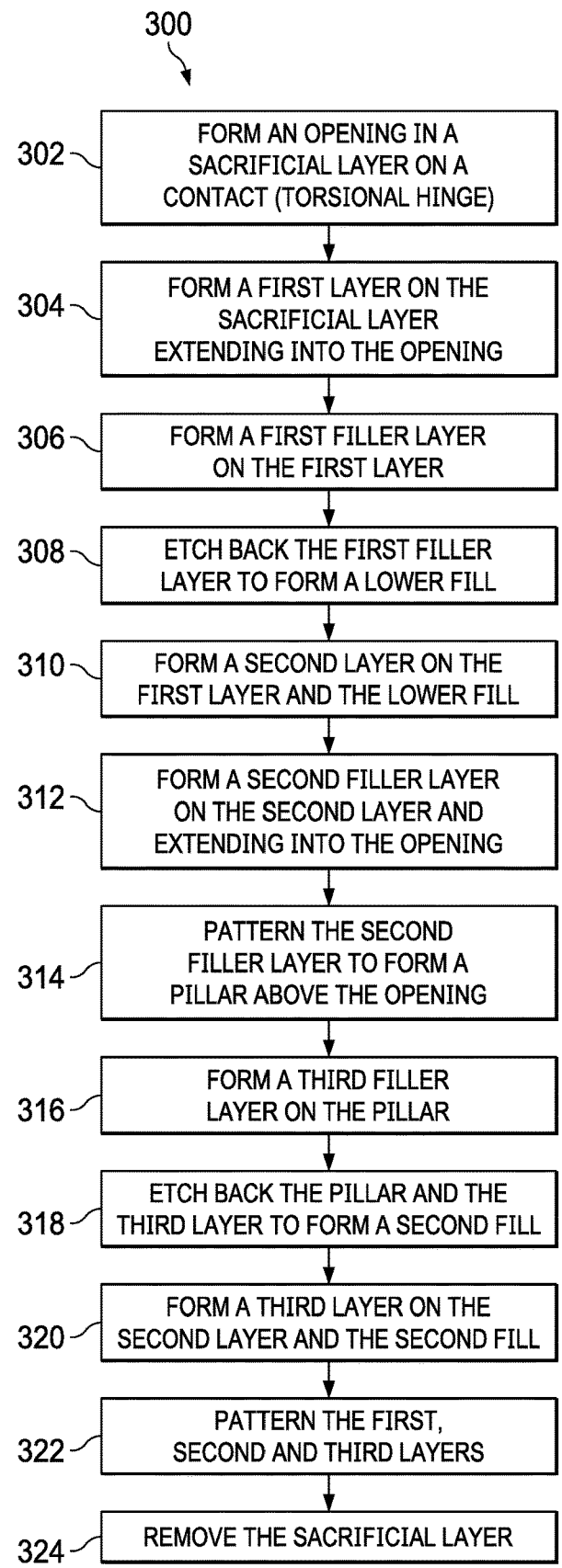
FIG. 3 is a flow diagram of an example method.

FIG. 3 is a flow diagram of an example method 300. At step 302, an opening is formed in a sacrificial layer to a base. The sacrificial layer corresponds to sacrificial layer 206, and the opening corresponds to opening 208 (FIG. 2). At step 304, a first layer is formed on the sacrificial layer extending into the opening and onto the base. The first layer corresponds to layer 210. At step 306, a first filler layer is formed on the first layer. The first filler layer corresponds to layer 212 (FIG. 2). In step 308, the first filler layer is etched to form a lower fill, which corresponds to lower fill 214 (FIG. 2). At step 310, a second layer is formed on the first layer and the lower fill. The second layer corresponds to layer 216 (FIG. 2). At step 312, the method forms a second filler layer on the second layer. The second filler layer corresponds to layer 218 (FIG. 2). At step 314, the second layer is patterned to form a pillar, which corresponds to pillar 219 (FIG. 2). At step 316, a third fill layer forms over the pillar. The third fill layer corresponds to layer 222 (FIG. 2). At step 318, the method etches back the third layer and the pillar to form a second fill, which corresponds to upper fill 224. At step 320, the method forms a third layer on the second layer and the second fill. The third layer corresponds to layer 226 (FIG. 2). At step 322 the method patterns the first, second and third layers, so this step corresponds to the patterning of FIGS. 2L-2N. At step 324, the method removes the sacrificial layers like sacrificial layer 202 and sacrificial layer 206 (FIG. 2). The resulting structure corresponds to the structure shown in FIG. 2O.

The arrangements provide a via with increased mechanical strength in a microelectromechanical (MEMS) device. In an example application, the MEMS device is a micromirror. In a further example, the micromirror is part of an array of mirrors in a spatial light modulator, such as a digital micromirror device (DMD).

Modifications are possible in the described examples, and other examples are possible, within the scope of the claims.

What is claimed is:

1. A micromechanical device, comprising:
   a substrate and a base formed on a surface of the substrate;
   a first layer extending from the base to a plane separated from the base by a via, the first layer forming an outer layer of the via and having a portion lying in the plane and surrounding the via;
   a first fill in a first portion of the via;
   a strut in the via on the first fill;
   a second fill in a second portion of the via, the second portion of the via extending from the strut to the plane, the second fill extending from the strut to a height less than 5% of a height of the via above the plane; and
   a second layer over the second fill, at least a portion of the second layer being over the portion of the first layer lying in the plane.

2. The micromechanical device of claim 1 wherein the first layer is an aluminum alloy.

3. The micromechanical device of claim 1 wherein the strut contacts the outer layer over a circumference of the strut in the via.

4. The micromechanical device of claim 1 wherein the strut is between 1 and 50 nm thick.

5. The micromechanical device of claim 1 wherein the first fill is a polymer.

6. The micromechanical device of claim 1 wherein the first fill and the second fill are formed from a same material.

7. The micromechanical device of claim 1 wherein the strut is an aluminum alloy.

8. The micromechanical device of claim 1, wherein the strut is one taken from a group consisting essentially of: silicon dioxide, silicon nitride, silicon oxynitride, and aluminum oxide.

9. The micromechanical device of claim 1 wherein the strut is a non-metal layer.

10. The micromechanical device of claim 1, wherein the strut is a metal layer.

11. The micromechanical device of claim 1 wherein the via is an inverted conical frustum.

12. The micromechanical device of claim 1 wherein the base is a torsional hinge.

13. The micromechanical device of claim 1 wherein the base is a portion of the surface of the substrate.

14. A micromirror device, comprising:
    a substrate and a base formed on a surface of the substrate;
    a first metal layer extending from the base to a plane separated from the base by a via, the first metal layer forming an outer layer of the via and having a portion lying in the plane;
    a first fill in a first portion of the via, the first fill including a polymer;
    a strut in the via on the first fill, the strut including a metal;
    a second fill in a second portion of the via, the second fill including the polymer, the second fill extending from the strut to a height less than 5% of a height of the via above the plane; and
    a second metal layer over the second fill, at least a portion of the second metal layer being over the portion of the first metal layer lying in the plane.

15. The micromirror device of claim 14 wherein the first metal layer includes aluminum.

16. The micromirror device of claim 14 wherein the second metal layer includes aluminum.

17. The micromirror device of claim 16 wherein the second metal layer forms a mirror of the micromirror.

18. The micromirror device of claim 14 wherein the polymer is BARC.

19. The micromirror device of claim 14 wherein the strut includes aluminum.

20. A method comprising:
    forming a sacrificial layer on a base formed on a surface of a substrate, the sacrificial layer having an upper surface away from the base;
    forming an opening in the upper surface of the sacrificial layer, and exposing a portion of the base in the opening;
    depositing a first layer on the upper surface of the sacrificial layer, extending into the opening and onto the exposed portion of the base;
    depositing a first fill layer onto the first layer;
    etching the first fill layer to remove the first fill layer from a surface of the first layer over the upper surface of the sacrificial layer and to form a first fill in the opening, the first fill having an upper surface closer to the base than to the upper surface of the sacrificial layer;
    depositing a second layer on the first layer over the upper surface of the sacrificial layer and on the upper surface of the first fill, the second layer having an upper surface away from the sacrificial layer;
    depositing a second fill layer on the upper surface of the second layer;
    etching the second fill layer to remove the second fill layer from the upper surface of the second layer over the upper surface of the sacrificial layer, and forming a second fill filling a remainder of the opening, the second fill having an exposed upper surface;

depositing a third layer on the upper surface of the second layer over the upper surface of the sacrificial layer and on the exposed upper surface of the second fill;

patterning the first layer, the second layer and the third layer; and removing the sacrificial layer.

21. The method of claim 20 wherein the first layer, the second layer and the third layer are metal.

22. The method of claim 21 wherein the metal includes aluminum.

23. The method of claim 20 wherein the first fill layer and the second fill layer include a polymer.

24. The method of claim 20 wherein depositing the first fill layer and depositing the second fill layer include depositing a spin-on coating.

25. The method of claim 20 wherein etching of the first fill layer and etching of the second fill layer include an anisotropic etching.

26. The method of claim 20 wherein depositing the first layer, depositing the second layer and depositing the third layer include depositing using physical vapor deposition.

27. The method of claim 20, wherein the second layer is a non-metal.

28. The method of claim 20, wherein depositing the second layer includes depositing one selected from a group consisting essentially of: silicon dioxide, silicon nitride, silicon oxynitride, and aluminum oxide.

29. The method of claim 28, wherein the first and third layers are aluminum.

* * * * *